United States Patent [19]
Sevastopoulos et al.

[11] Patent Number: 6,121,908
[45] Date of Patent: Sep. 19, 2000

[54] MONOLITHIC FILTER GAIN CONTROL CIRCUITS AND TECHNIQUES WITH FAVORABLE NOISE BEHAVIOR

[75] Inventors: Nello G. Sevastopoulos, Saratoga; Max Wolff Hauser, Sunnyvale, both of Calif.

[73] Assignee: Linear Technology Corporation, Milpitas, Calif.

[21] Appl. No.: 09/143,627

[22] Filed: Aug. 28, 1998

[51] Int. Cl.[7] .................................................. H03M 1/62
[52] U.S. Cl. ............................................. 341/139; 330/85
[58] Field of Search ................................... 341/144, 139, 341/118; 330/85, 86, 278

[56] References Cited

U.S. PATENT DOCUMENTS

| 4,441,080 | 4/1984 | Saari ........................................... 330/86 |
| 5,412,335 | 5/1995 | Jackson et al. ........................... 327/552 |

FOREIGN PATENT DOCUMENTS 915346  12/1999  European Pat. Off. ........ G01R 19/00

OTHER PUBLICATIONS

A. Sedra et al. *Microelectronic Circuits, 3D Edition* pp. 804–805 (1991).

*Primary Examiner*—Brian Young
*Assistant Examiner*—Peguy JeanPierre
*Attorney, Agent, or Firm*—Fish & Neave; Robert W. Morris; Joel Weiss

[57] ABSTRACT

Circuits and techniques for controlling gain while performing analog frequency-selective filtering of electronic signals are provided. In particular, these circuits and techniques control gain and filter electronic signals in a way that significantly reduces input-referred noise as the gain increases to accommodate smaller input signals, while operating within reasonable power constraints and employing a minimum amount of die space. Such circuits also significantly reduce the circuitry necessary for performing the combined steps of controlling gain and doing analog frequency-selective filtering of electronic signals.

32 Claims, 9 Drawing Sheets

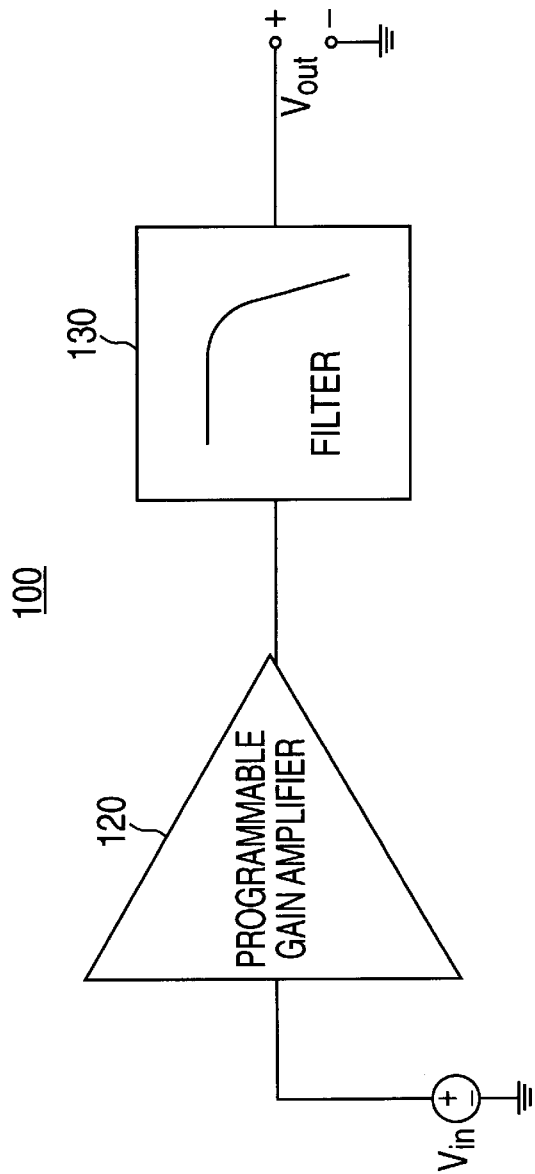
**FIG. 1
PRIOR ART**
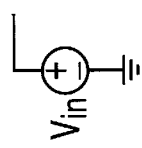

(Noise bandwidth = 100kHz, Amplifier noise =1µV$_{rms}$)
(A): R$_2$ = 600 Ω (Discrete - Component example), gain control by changing R$_1$
(B): R$_2$ = 30k Ω (Monolithic example), gain control by changing R$_1$
(C): R$_1$ = 30k Ω (Monolithic example), gain control by changing R$_2$

MONOLITHIC FILTER GAIN CONTROL CIRCUITS AND TECHNIQUES WITH FAVORABLE NOISE BEHAVIOR

BACKGROUND OF THE INVENTION

This invention relates to gain control and analog frequency-selective filtering of electronic signals. In particular, this invention relates to circuits and techniques for controlling gain and filtering a signal in ways which limit the introduction of noise to the signal while operating within reasonable power constraints and employing a minimum amount of die space.

Gain control and analog frequency-selective filtering are typical needs in electronic systems that operate on analog input signals with widely-varying amplitude. This situation arises, for example, in receivers of many kinds (including radio, cable modems, sonar, ultrasound) and in the preprocessing of signal inputs for sampling and analog-to-digital conversion. Electrical noise introduced by the circuitry that performs the gain control and filtering must be minimized since it corrupts the input signal.

A traditional approach to filtering signals with wide amplitude range is to add a separate explicit variable-gain circuit (often called a variable-gain amplifier or programmable-gain-amplifier, VGA or PGA, respectively) in the signal path prior to a filter. This amplifier amplifies small signals so they can be processed by the rest of the circuit. This conventional approach requires additional circuitry for the PGA and the filter (and therefore more power). The additional circuitry also tends to introduce more noise into the signals.

In view of the foregoing, it would be desirable to provide circuits for controlling the gain of electronic signals and filtering electronic signals requiring less components than required by conventional circuits.

It would be further desirable to provide circuits for controlling the gain of electronic signals and filtering electronic signals while reducing the power required by the circuits.

It would be still further desirable to provide circuits for controlling the gain of electronic signals and filtering electronic signals while minimizing the die space required by the circuits.

It would be yet further desirable to provide circuits for controlling the gain of electronic signals and filtering electronic signals while reducing the introduction of electronic noise by the gain control and filtering circuits.

SUMMARY OF THE INVENTION

It is an object of this invention to provide circuits for controlling the gain of electronic signals and filtering electronic signals requiring less components than required by conventional circuits.

It is a further object of this invention to provide circuits for controlling the gain of electronic signals and filtering electronic signals while minimizing the power required by the circuits.

It is a still further object of this invention to provide circuits for controlling the gain of electronic signals and filtering electronic signals while minimizing the die space required by the circuits.

It is yet a further object of this invention to provide circuits for controlling the gain of electronic signals and filtering electronic signals while reducing the introduction of electronic noise by the gain control and filtering circuits.

In accordance with this invention, filter gain control circuits with very low noise for filtering an input signal $V_{in}$ are provided. The circuits have a passband gain that influences the input signal. The circuits also have an input, an output for producing a filtered output signal $v_{out}$, a component of the output signal $v_{out}$ being provided by an electrical noise produced by the filter circuit, and a frequency-shaping circuit coupled between the input and the output that governs the passband gain of the filter circuit.

The frequency-shaping circuit includes: a variable impedance element coupled to the input, $v_{in}$, such that the passband gain of the filter circuit is substantially inversely proportional to the impedance value of the variable impedance element, an active circuit having a virtual ground node coupled to the variable impedance element, an output node coupled to the output, and a feedback network coupled between the virtual ground node and the output node, including resistors and operational amplifiers, such that reducing the impedance value of the variable impedance element increases the passband gain of the filter circuit more precipitously than it increases electrical noise in $v_{out}$.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 1 is a block diagram of a known system for controlling the gain and filtering a signal.

DETAILED DESCRIPTION OF THE INVENTION

Figure 2:
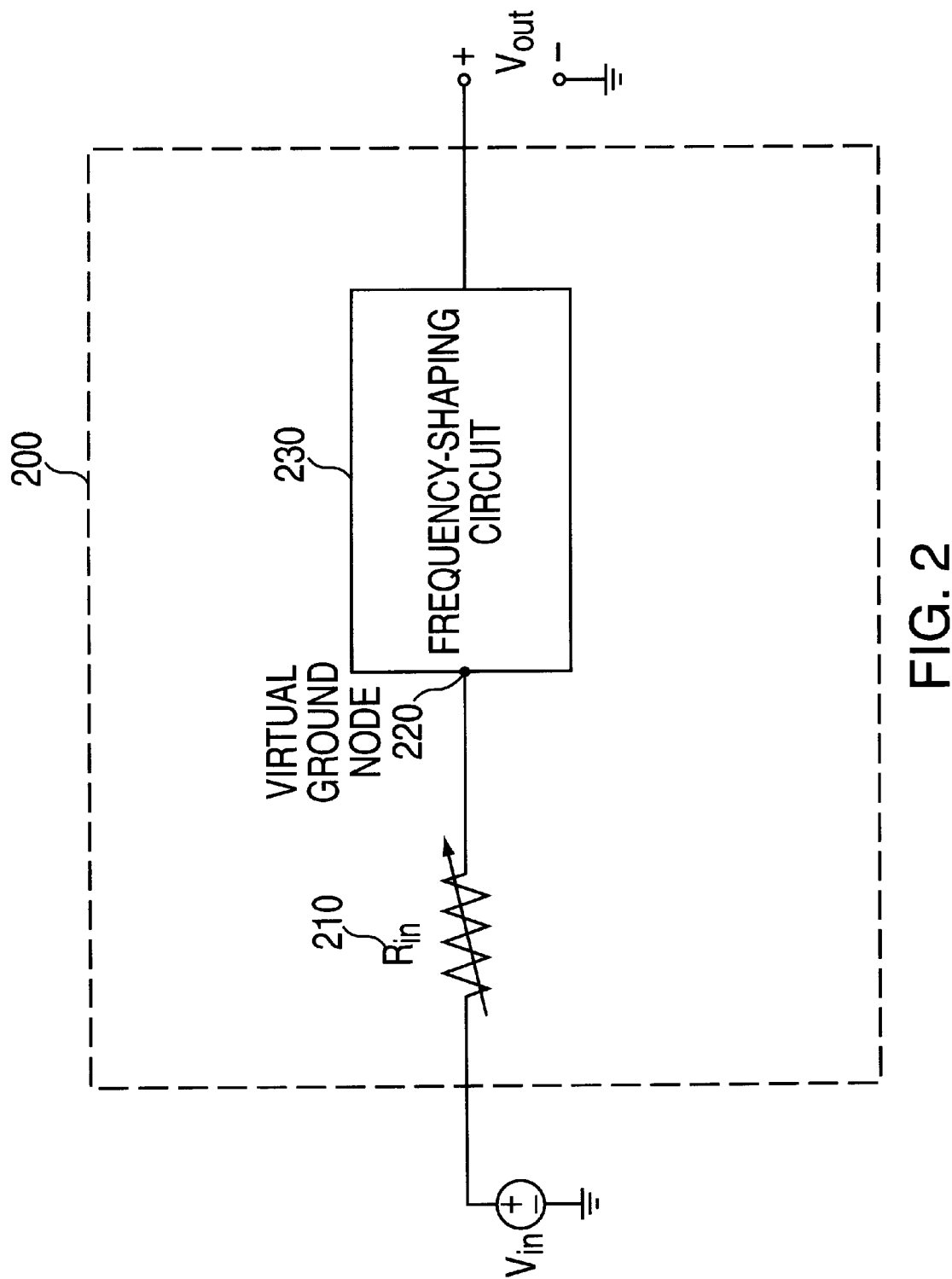
FIG. 2 is a block diagram of a circuit for controlling the gain and filtering a signal according to the present invention.

The present invention addresses the problems of noise and the need for additional circuitry and power found in gain control and analog frequency-selective filtering of electronic signals.

According to the present invention, the circuits described augment a class of on-the-chip, i.e., monolithic, filters to add gain control, with minimal additional circuitry, in such a way that the noise from the signal, i.e., input-referred noise, significantly drops as the gain rises. This extends the input "dynamic range" of the electronic system, since lower-amplitude input signals do not experience a proportional loss in signal-to-noise ratio (SNR).

The circuit also does not require a separate amplifier circuit, does not increase the noise above that of the filter alone, and in effect reduces the filter's own noise in the course of introducing gain.

In an op-amp-based active RC filter, where a single resistor couples the input voltage to the virtual-ground node of an operational amplifier, the overall gain of the filter is inversely proportional to the input resistor's value. This resistor's value also affects, in various ways, the gain seen by noise sources within the filter. Under certain conditions that are not true in general, but can be made true by design, especially in the case of monolithic filters, raising the signal gain by the specific method of reducing the value of the resistor causes a much less-than-proportional increase in the filter's output noise, so that the input-referred noise drops significantly, as described above.

The circuit condition required to bring this about is that the dominant noise sources in the filter be the thermal noise in resistors, rather than noise from the amplifiers. This condition occurs more naturally in monolithic than in off-the-chip, i.e., discrete, designs for the following reason: a well-known property of active-RC and other analog filters is that the resistor noise sources and the bandwidth of the filter interact so that the net output noise due to the resistors depends not on their magnitude, as the individual noise sources do, but instead on the magnitude of the capacitors (which are not themselves significant sources of noise). The filter's mean-squared output voltage noise tends to be proportional to kT/C (k is Boltzmann's constant, T absolute temperature, and C the magnitude of the circuit capacitors.) Filters where the amplifiers and capacitors are integrated on the same chip tend to use smaller capacitors than do filters of discrete components because the capacitance is relatively expensive and the undesired stray capacitances in the circuit are smaller. Consequently, kT/C tends to be larger with monolithic than with discrete capacitors. Not only do smaller capacitors shift noise dominance to resistors, but smaller capacitors also force larger resistor values because, for a given filter corner frequency, the resistors are proportional to 1/C. Large resistor values are further important because they consume less power. Less power is consumed by larger resistors because passing a voltage across a larger resistor requires less current than passing a voltage across a smaller resistor. Less current also loads the amplifiers lightly and therefore tends to reduce signal distortion.

Various embodiments of the invention employ different forms of variable input resistance. There are multiple ways of implementing the variation of the input resistance, $R_{IN}$. The $R_{IN}$ resistor may be outside the chip and varied manually, using a variable resistor. In a more preferred alternative, the input resistance, $R_{IN}$, is implemented using fixed resistors and electronic switches to vary the total resistance.

This configuration is sometimes used by itself as a multiplying digital-to-analog converter (MDAC). Digital-to-analog conversion using an MDAC is accomplished by weighting the resistive value of the resistors. For example, resistors can be weighted in a binary ratio such that each additional resistor has half the resistive value of the preceding resistor. The lowest value resistor is assigned to the most significant bit (MSB) of the digital input. This method of digital-to-analog conversion is well known in the art. Many other arrangements of switches and resistors known in the art will achieve the same effect, namely an electronically variable $R_{IN}$ that varies in steps. Such a circuit can be added off-the-chip using relays or suitable electronic analog switches, or it may be added on-the-chip.

Other active-RC filter configurations employing input capacitors, in place of $R_{IN}$, are useful as filters with highpass and bandpass requirements. The invention as described can also be extended to capacitive inputs, substituting capacitors for the fixed resistors mentioned above. This yields a similar dynamic-range extension specifically for applications requiring a non-lowpass filter response.

FIG. 1 shows a known circuit 100 for controlling gain of electronic signals and filtering the electronic signals, and exemplifies the problem that the invention addresses. The input signal enters at $v_{in}$. The circuit includes two elements to accomplish the separate tasks of controlling gain and filtering. It utilizes a Programmable Gain Amplifier, or PGA 120, for amplifying the gain, and a filter 130 for filtering the signal. The output of the circuit is represented by $v_{out}$, where the signal may be transferred to later stages.

FIG. 2 shows a preferred embodiment of the filter circuit 200 in accordance with the principles of the present invention. The input signal enters at $v_{in}$. Filter circuit 200 preferably includes variable resistor 210 (which can be interchanged with different variable impedances as will be explained below), virtual ground node 220, and frequency-shaping circuit 230. In practice, a virtual ground node indicates a node whose potential is held at ground through the action of circuitry, for example negative feedback circuitry, even though the node itself is not directly connected to ground. Though the node is held at ground, it may alternatively be held at some other suitable reference voltage. Fundamentally, the frequency shaping circuit 230 is responsive to current flowing into the virtual ground node from outside the frequency shaping circuit 230. In FIG. 2, that current results from the combination of Vin, variable resistor 210, and the virtual ground node 220. Virtual ground node 220 may preferably be part of frequency-shaping circuit 230.

$V_{out}$ represents the output of filter circuit 200, where the signal may be transferred to later stages. The invention preferably achieves the same goals as the known circuits, specifically controlling gain and filtering, but does so without the need for an additional amplifier, thus reducing power and die size required for filter circuit 200. The gain control is accomplished by the addition of variable input resistor 210 ($R_{in}$) at the input of filter circuit 200.

Figure 3:
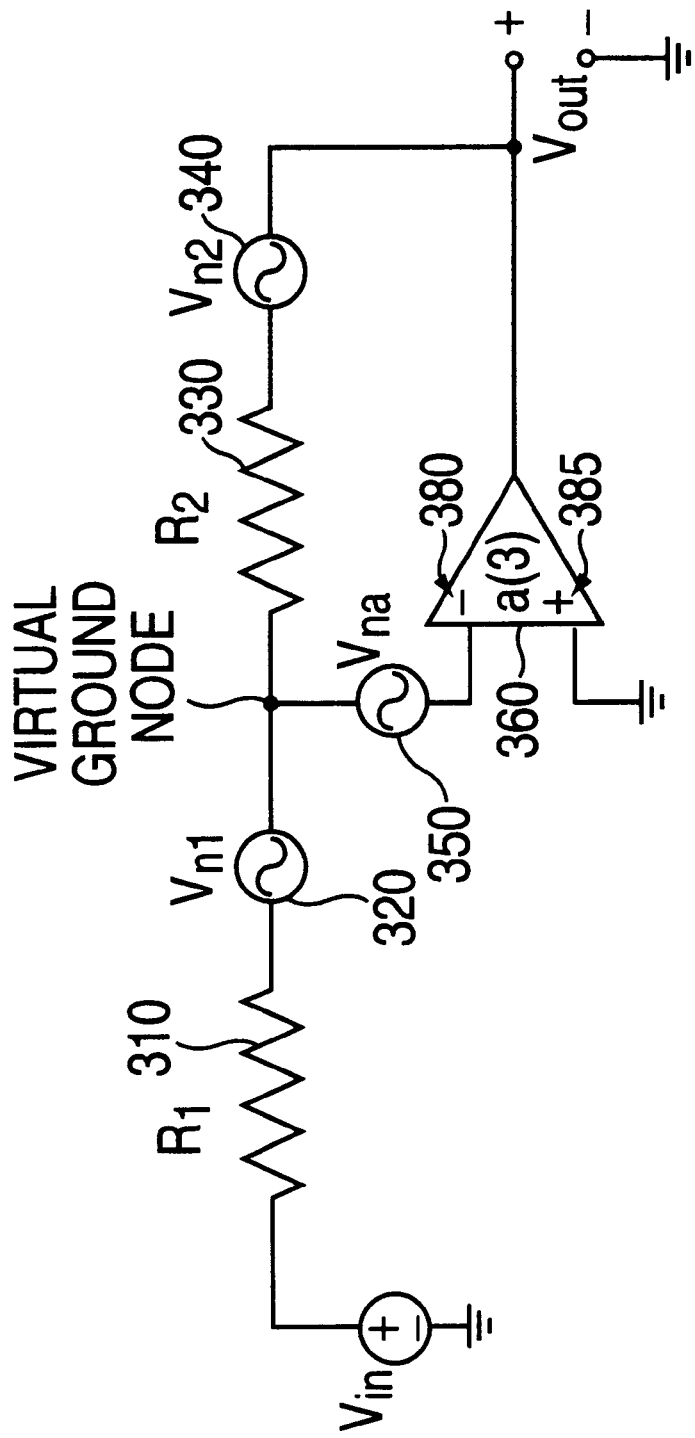
FIG. 3 is a block diagram of a known virtual-ground input circuit with three sources of noise.

Unlike known circuits implementing filter gain control methods, the circuits of the present invention significantly decrease the input-referred noise when accommodating smaller input signals by increasing gain, and thereby increase the range of the input signals over which the filter is useful. FIG. 3 illustrates dynamic-range extension according to the principles of the invention by analyzing the electrical noise of a prototypical circuit 300. Circuit 300 consists of $v_{in}$, input resistor 310 ($R_1$), feedback resistor 330 ($R_2$), and operational amplifier 360 with negative terminal 380. Operational amplifier 360 has negligible input current. Three components $v_{na}$ 350, $v_{n1}$ 320, and $v_{n2}$ 340, model the inherent noise sources of circuit 300 as voltage sources. These noise sources represent the noise originating in operational amplifier 360, and resistors 310, 330. A virtual ground node is represented in the circuit at the connection between the three components. This node acts as a virtual ground node because operational amplifier 360's positive terminal 385 is coupled to ground, and its negative feedback forces its negative input terminal's potential to track the potential at its positive input terminal 385. The gain of operational amplifier 360 is represented in the usual Laplace-transform notation as "a(s)." The total output noise, $v_{on}$, is equivalent to the output $v_{out}$ when $v_{in}$ is zero, and $v_{out}$ is due only to noise sources $v_{na}$, $v_{n1}$, and $v_{n2}$. Alternatively, the total noise of the circuit can be represented as an equivalent input noise (the "input-referred" noise), $v_i$.

Analyzing circuit 300 as a linear circuit with $v_{na}$, $v_{n1}$, and $v_{n2}$ treated as independent voltage sources, the output voltage $v_{out}$ is:

$$v_{out} = \frac{a(s)}{1 + [a(s) + 1]\frac{R_1}{R_2}}\left[-v_{in} + \left(1 + \frac{R_1}{R_2}\right)v_{na} + v_{n1} + \frac{R_1}{R_2}v_{n2}\right] \quad (1)$$

Under the normal condition that the loop gain is high, or equivalently:

$$|a(s)| \gg \frac{R_2}{R_1}$$

the common gain factor in equation (1) becomes:

$$\frac{a(s)}{1 + [a(s) + 1]\frac{R_1}{R_2}} \to \frac{R_2}{R_1}$$

and the output expression simplifies to:

$$\begin{aligned}v_{out} &= -\frac{R_2}{R_1}v_{in} + \left(\frac{R_2}{R_1} + 1\right)v_{na} + \frac{R_2}{R_1}v_{n1} + v_{n2} \\ &= -\gamma v_{in} + (\gamma + 1)v_{na} + \gamma v_{n1} + v_{n2}\end{aligned} \quad (2)$$

where $\gamma = R_2/R_1$. $\gamma$ (gamma) has the interpretation of the nominal voltage-gain magnitude from $v_{in}$ to $v_{out}$. Assuming for convenience—it is not essential to the main result—that the circuit has a substantially flat frequency response over a bandwidth B of interest, the mean-squared output noise component, or "noise power" is:

$$\overline{v_{on}^2} = (\gamma+1)^2\overline{v_{na}^2} + \gamma^2\overline{v_{n1}^2} + \overline{v_{n2}^2}. \quad (3)$$

Noting that $v_{n1}$ and $v_{n2}$ are thermal noise sources, with power:

$$\overline{v_{n1}^2} = 4kTR_1B,$$

$$\overline{v_{n2}^2} = 4kTR_2B,$$

(where k is Boltzmann's constant, and T is absolute temperature), equation (3) becomes:

$$\overline{v_{on}^2} = (\gamma+1)^2\overline{v_{na}^2} + (\gamma+1)4kTBR_2 = (\gamma+1)^2\overline{v_{na}^2} + (\gamma+1)\overline{v_{n2}^2}. \quad (4)$$

When $R_1$ is varied for gain control, the $\overline{v_{n2}^2}$ factor stays constant. Additionally, the input and output signal powers are related by:

$$\overline{v_{os}^2} = \gamma^2\overline{v_{in}^2}.$$

The total noise from the circuit can be represented equivalently as an input-referred noise voltage $v_i$, whose power is the output noise power divided by the circuit's power gain, or $$\overline{v_i^2} = \frac{\overline{v_{on}^2}}{\gamma^2}.$$

From equation (4) this input-referred noise is $$\overline{v_i^2} = \frac{(\gamma + 1)^2}{\gamma^2}\overline{v_{na}^2} + \frac{(\gamma + 1)}{\gamma^2}\overline{v_{n2}^2}. \quad (5)$$

Thus, it follows that this input-referred noise level always falls with increasing $\gamma$. Such a behavior is desirable, since increasing gain $\gamma$ coincides with smaller signal input ($v_{in}$) amplitudes and a lower $\overline{v_i^2}$ means a higher signal-to-noise ratio (SNR):

$$SNR = \frac{\overline{v_{in}^2}}{\overline{v_i^2}}.$$

The input-referred noise $\overline{v_i^2}$ approaches a lower limit of $\overline{v_{na}^2}$ as the gain parameter $\gamma$ becomes very large. On the other hand, for low gain $\gamma$ (for example, $\gamma=1$), the total noise can be dominated by the $\overline{v_{n2}^2}$ term in equation (5) if the value of $R_2$ is constrained by other considerations to be relatively large.

Prior filter art generally assumed that the $\overline{v_{na}^2}$ term dominated in equation (5) and that $R_2$ could be made as small as necessary to insure this. Such prior art did not recognize or exploit the noise advantage of using $R_1$ for gain control, which is that it modulates the total noise in a favorable manner when the $\overline{v_{n2}^2}$ term in equation (5) is large.

The following example illustrates the significance of this method of favorable noise control for monolithic filters. In a filter with bandwidth or "corner frequencies" of 50 kHz, the noise bandwidth of interest, B, will typically be 100 kHz. The magnitude of capacitors in such a filter depends on implementation: a discrete-component version could easily use capacitors of value 0.005 microfarads, implying associated resistor values of about 600 ohms for a corner frequency of 50 kHz (R=1/2πfC.) On the other hand, a monolithic filter implementation is limited by die area and fabrication constraints to using capacitors on the order of 100 picofarads (several of which are needed in a complete filter product,) implying a resistor magnitude of 30K ohms to form the same 50 kHz corner frequency. For both implementations, a low-noise amplifier might exhibit an RMS input noise $v_{na}$ of 1 microvolt in 100 kHz bandwidth.

The resistors in FIG. 3 tend to be proportional to 1/2πfC. There is further rationing between them to set the gain, as described earlier. With a high gain in operational amplifier 360, the closed-loop signal gain $v_{out}/v_{in}$ is $\gamma=R_2/R_1$ as shown above. From equation (5), the input-referred noise voltage due to the amplifier and the resistors can be calculated directly.

Figure 3A:
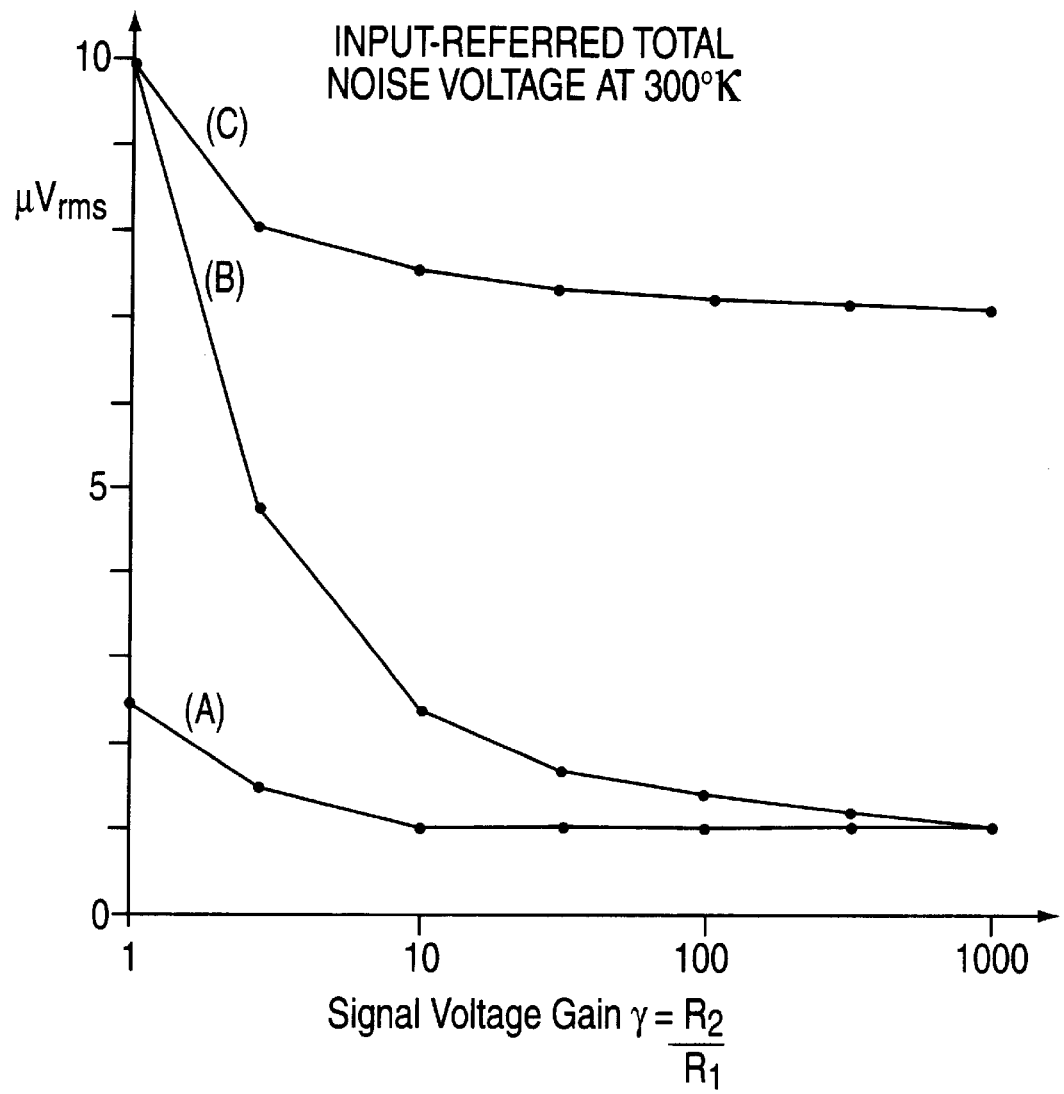
FIG. 3A is a chart of input-referred total noise voltage at different signal gain settings.

FIG. 3A is a graph contrasting the input-referred noise voltage in FIG. 3 for three different situations of gain control. In curve (A) corresponding to the discrete-component example introduced above, $R_2=600$ ohms and $R_1$ is varied for gain control. In curve (B), representing the monolithic example, $R_2=30k$ ohms and again $R_1$ effects gain control. Curve © shows the same monolithic example but with $R_2$ varied for gain control while $R_1$ remains fixed at 30k ohms.

FIG. 3A shows how each case exhibits some reduction of input-referred noise with increasing gain, but only the proper combination of gain-control mechanism and component magnitudes achieves a large change in input-referred noise voltage (10 $\mu V_{rms}$-to-1 $\mu V_{rms}$, or 20 dB. in this example.) This feature was not obvious with discrete-component filters, as elaborated earlier.

Figure 4:
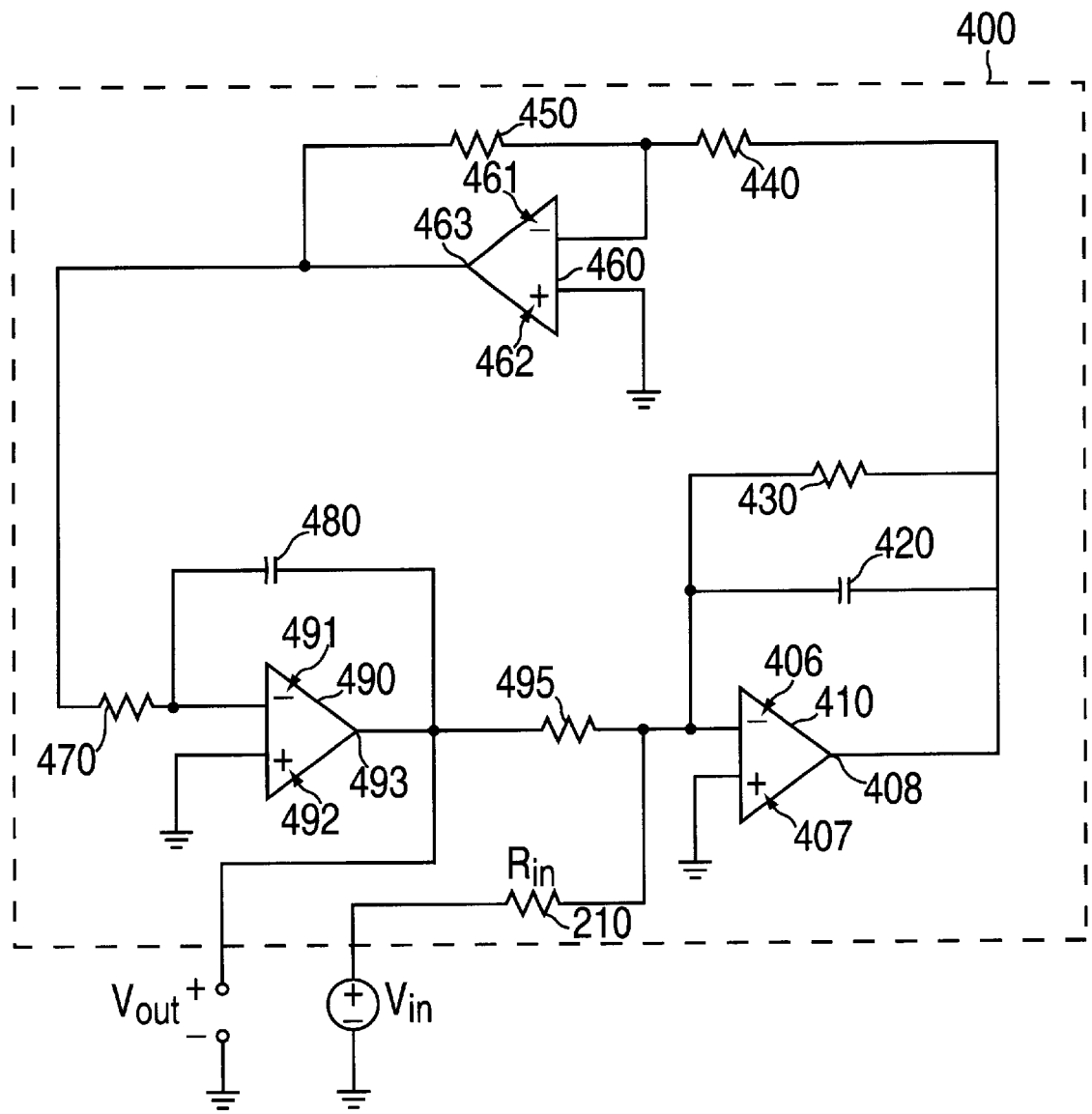
FIG. 4 is a block diagram of one embodiment of the gain and filter control circuit of FIG. 2 according to the invention.

Although demonstrated in a simple prototype amplifier circuit in FIG. 3, the result carries over to other circuits with a gain-setting component leading into a virtual ground such as circuit 200 of FIG. 2 (see also circuit 400 of FIG. 4.) The noise benefit is of practical utility in filters, rather than amplifiers, because of the link of resistor values to capacitor values in filters. Laboratory tests using the circuit of FIG. 4 showed a 15 dB improvement in SNR over a 40 dB gain range realized by varying $R_{in}$.

This finding clearly indicates an extension of dynamic-range when, at low gains, resistor noise dominates over amplifier noise in the system.

FIG. 4 shows one preferred embodiment of the invention with variable resistor 210 ($R_{in}$), coupled between input $v_{in}$, of filter circuit 400 and the negative terminal 406 of operational amplifier 410. In op-amp 410, negative terminal 406 acts as a virtual ground node. Positive terminal 407 is coupled to ground, and the op-amp's negative feedback forces its negative input terminal's potential to track the potential at its positive input terminal. Virtual ground can be replace by any suitable reference voltage. Operational amplifier 410 has negligible input current. Feedback resistor 430 and feedback capacitor 420 are coupled between negative terminal 406 and output 408 of feedback operational amplifier 410. Resistor 440 is also coupled to output 408.

Operational amplifier 460 has a negative terminal 461 coupled to input resistor 440, a positive terminal 462 coupled to ground, and an output 463. Resistor 450 is coupled between negative terminal 461 and output 463 of operational amplifier 460. Resistor 470 is coupled to output 463 of operational amplifier 460. Operational amplifier 490 has a negative terminal 491 coupled to resistor 470, a positive terminal 492 coupled to ground, and an output 493. Capacitor 480 is coupled between negative terminal 491 and output 493 of operational amplifier 490. Resistor 495 is coupled between output 493 of operational amplifier 490, and negative terminal 406 of operational amplifier 410. Output 493 is also coupled to $v_{out}$.

The circuit of FIG. 4 may realize the advantages of invention when constructed and operated using the following components and values:

| Component | Possible Value |
| --- | --- |
| Feedback Capacitor 420 | 159 picofarads |
| Feedback Resistor 430 | Application-dependent |
| Resistor 440 | 10K ohms |
| Resistor 450 | 10K ohms |
| Resistor 470 | 10K ohms |
| Capacitor 480 | 159 picofarads |
| Resistor 495 | Application-dependent |
| Resistor $R_{in}$ | Variable (100 ohms to 10k ohms) |

Figure 5:
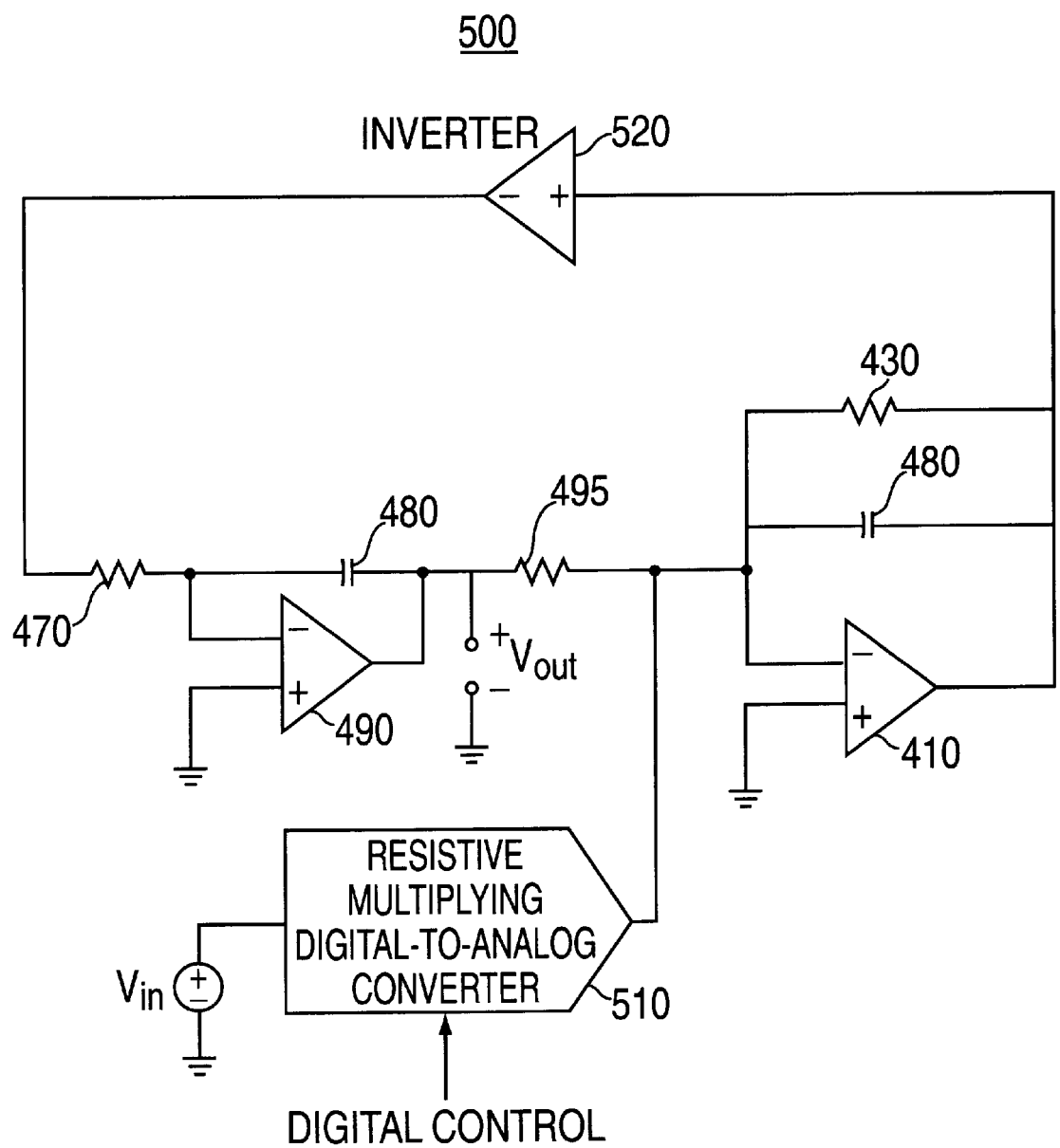
FIG. 5 is a block diagram of the filter circuit of FIG. 4 with a digitally variable resistor.

Alternative embodiments of the invention shown in FIG. 4 can be constructed by implementing different types of variable resistors. FIG. 5, for example, shows essentially the same circuit as shown in FIG. 4, but with a different type of variable resistor instead of variable resistor 210. Circuit 500 in FIG. 5 uses a switched resistor array, which industrial practice commonly terms a multiplying digital-to-analog converter (MDAC) 510, in place of variable resistor 210 found in FIG. 4. In addition, inverter 520 is a symbolic representation of an analog inverter similar to inverting operational amplifier 460 and resistors 440 & 450 or an inverter implemented by other suitable means.

Figure 6:
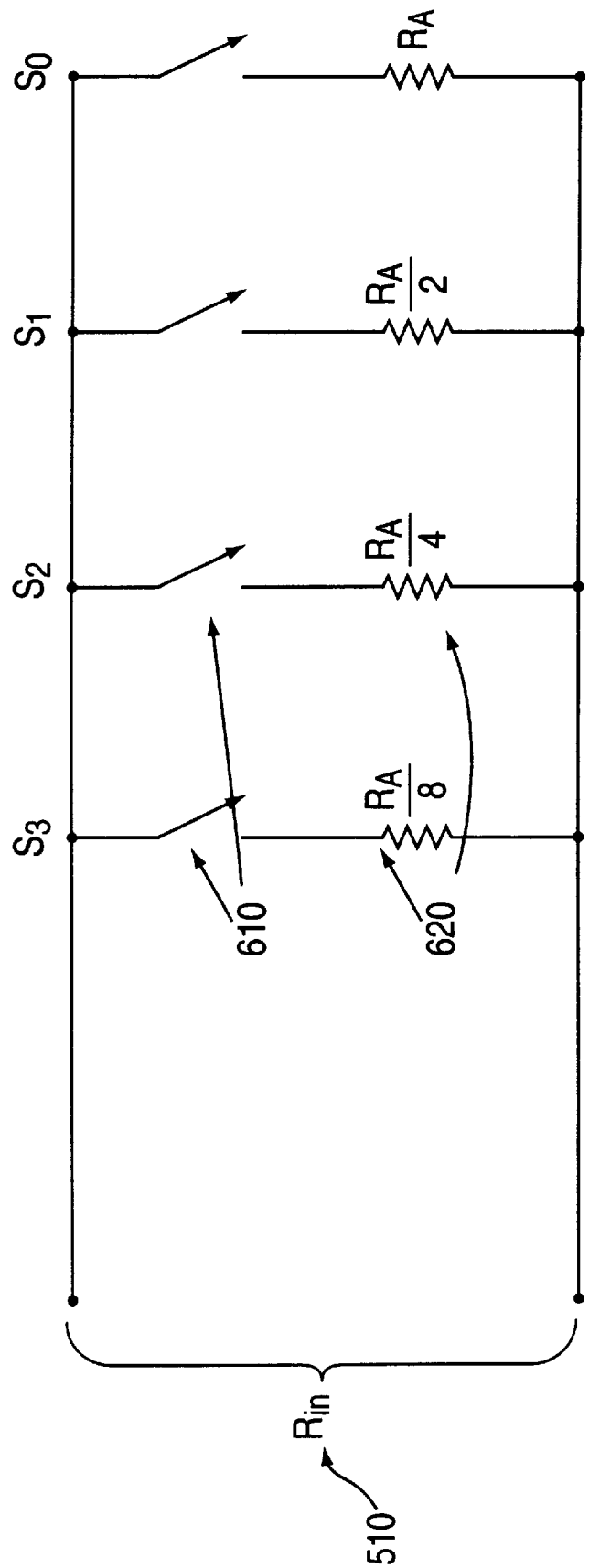
FIG. 6 is a block diagram of one embodiment of a known digitally variable resistor.

FIG. 6 shows one embodiment of MDAC 510 of FIG. 5 in greater detail as an arrangement of switches 610 and fixed resistors 620. If resistors 620 are binary weighted, the MDAC can accept a digital word of some pre-determined bit size and produce a corresponding resistance. This arrangement is sometimes used by itself as an MDAC. Other arrangements of switches and resistors known in the art may be used to achieve a similar effect of preferably providing an electrically variable resistor in steps, without departing from the scope of the present invention.

Figure 7:
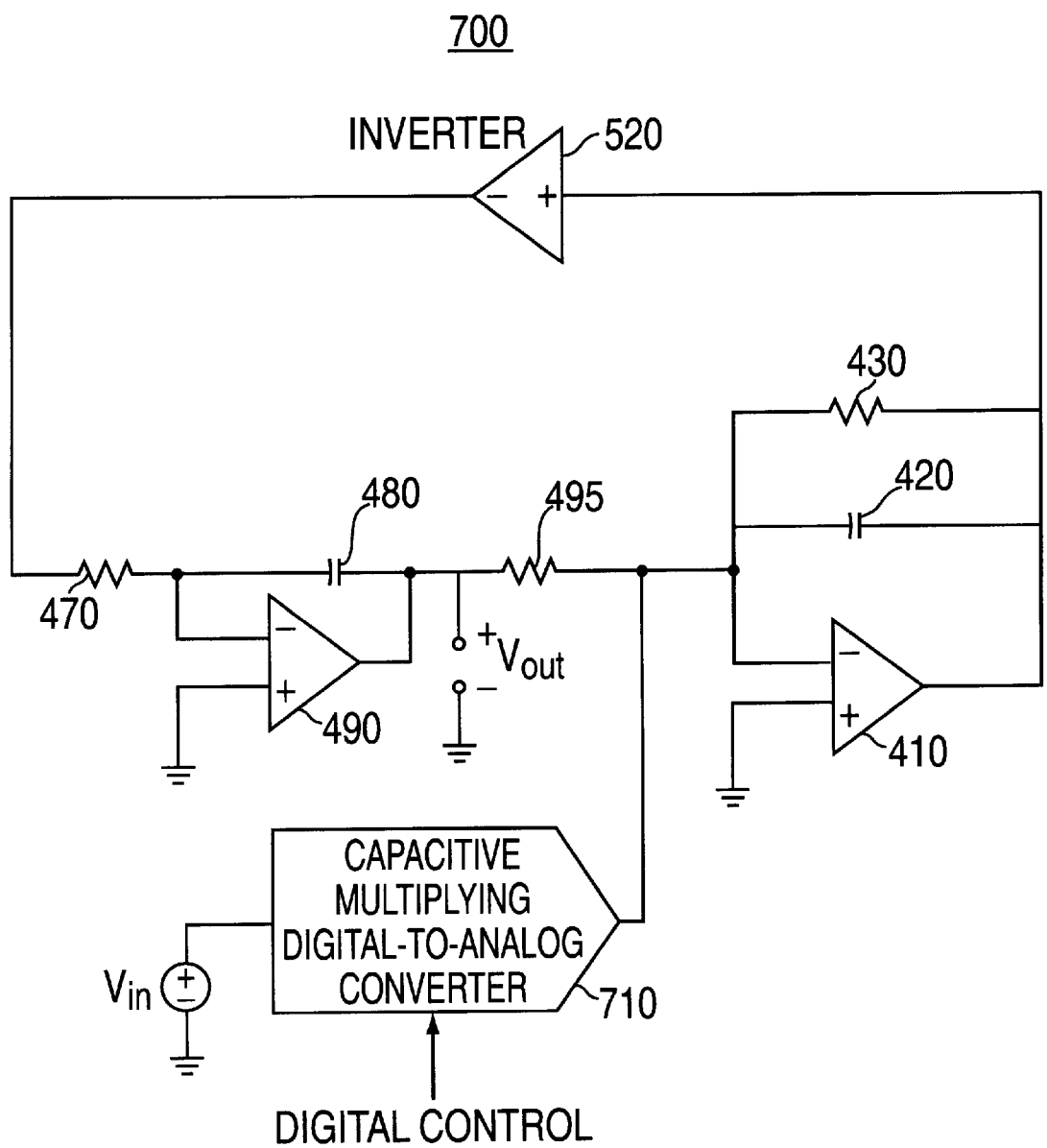
FIG. 7 is a block diagram of the filter circuit of FIGS. 4 and 5 with a digitally variable capacitor.

FIG. 7 shows another type of variable impedance that may be used in accordance with the present invention. Circuit 700 in FIG. 7 shows a capacitive MDAC 710 in place of variable resistor 210 of FIG. 4. This arrangement is effective for varying the input impedance with non-lowpass filters. In addition, inverter 520 is configured as shown and described above with respect to FIG. 5.

Figure 8:
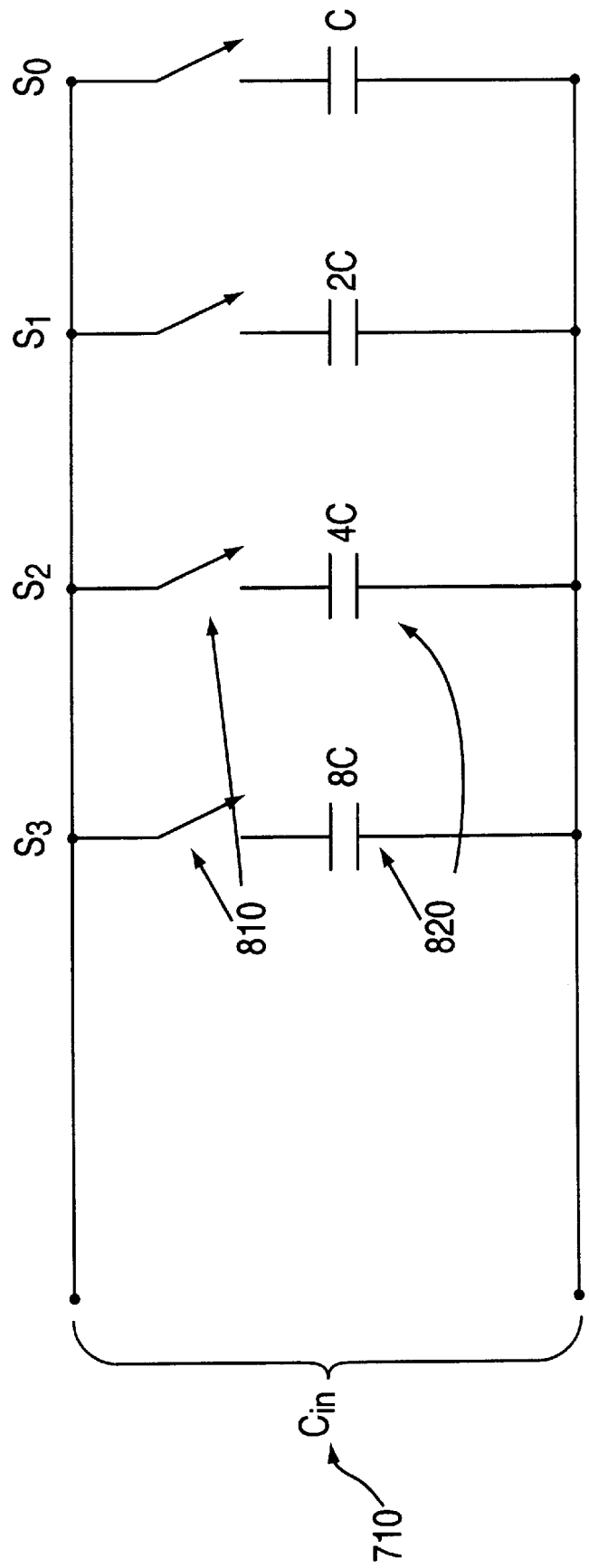
FIG. 8 is a block diagram of a known digitally variable capacitor.

FIG. 8 shows one embodiment of capacitive MDAC 710 of FIG. 7 in greater detail as an arrangement of switches 810 and capacitors 820. Other arrangements of switches 810 and fixed capacitors 820 known in the art may be used to achieve a similar effect of preferably providing electrically variable capacitor 710 in steps, without departing from the scope of the present invention.

Thus it is seen that filter circuits operating at relatively low power, capable of filtering and providing gain for input signals while minimizing noise, have been provided. Persons skilled in the art will appreciate that the present invention can be practiced by other than the described embodiments, which are presented for purposes of illustration rather than of limitation, and the present invention is limited only by the claims which follow.

What is claimed is:

1. A substantially monolithically integrated filter circuit for filtering an input signal $v_{in}$, said filter circuit having a passband gain and comprising:
    an input for receiving said input signal;
    an output for producing a filtered output signal $v_{out}$, said output signal including a component of electrical noise produced by said filter circuit; and
    a frequency-shaping circuit coupled between said input and said output that governs the passband gain of said filter circuit including:
        a variable impedance element coupled to said input such that the passband gain of said filter circuit is substantially inversely proportional to the impedance value of said variable impedance element;
        an active circuit having a virtual ground node coupled to said variable impedance element, and an output node coupled to said output; and
        a feedback network coupled to said virtual ground node and to said output node and including resistors and operational amplifiers, such that the electrical noise in $v_{out}$ is dominated by electrical noise from said resistors of said feedback network.

2. The filter circuit of claim 1 wherein reducing the impedance value of said variable impedance element increases the passband gain of said filter circuit more precipitously than it increases the electrical noise in $v_{out}$.

3. The filter circuit of claim 1 wherein said variable impedance element is a discrete element.

4. The filter circuit of claim 1 wherein said variable impedance element is manually adjustable.

5. The filter circuit of claim 1 wherein said variable impedance element is electronically adjustable.

6. The filter circuit of claim 5 wherein said variable impedance element comprises a resistive multiplying digital-to-analog converter.

7. The filter circuit of claim 5 wherein said variable impedance element comprises an array of switches and resistors.

8. The filter circuit of claim 7 wherein said array comprises:
   at least two electronic switches coupled between said input and said frequency-shaping circuit; and
   at least one weighted resistor coupled to each of said electronic switches.

9. The filter circuit of claim 8, wherein said at least one weighted resistor comprises a first weighted resistor and a second weighted resistor said first weighted resistor being coupled to a first one of said electronic switches and said second weighted resistor being coupled to a second one of said electronic switches, wherein said second weighted resistor has a resistive value fixed at some pre-determined proportion of the resistive value of said first weighted resistor.

10. The filter circuit of claim 5 wherein said frequency-shaping circuit is a non-lowpass filter and wherein said variable impedance element comprises a capacitive multiplying digital-to-analog converter.

11. The filter circuit of claim 10 wherein said variable impedance element comprises an array of switches and capacitors.

12. The filter circuit of claim 11 wherein said array comprises:
   at least two electronic switches coupled between said input and said frequency-shaping circuit; and
   at least one weighted capacitor coupled to each of said electronic switches.

13. The filter circuit of claim 12, wherein said at least one weighted capacitor comprises a first weighted capacitor and a second weighted capacitor said first weighted capacitor being coupled to a first one of said electronic switches and said second weighted capacitor being coupled to a second one of said electronic switches, wherein said second weighted capacitor has a capacitive value fixed at some pre-determined proportion of the capacitive value of said first weighted capacitor.

14. The filter circuit of claim 1 wherein said frequency-shaping circuit is a non-lowpass filter and wherein said variable impedance element comprises a capacitor-array multiplying digital-to-analog converter.

15. The filter circuit of claim 1 wherein said feedback network comprises:
   a feedback operational amplifier having a negative terminal coupled to said variable impedance element, a positive terminal coupled to a reference voltage, and an output;
   a feedback resistor coupled between said feedback operational amplifier negative terminal and said feedback operational amplifier output;
   a feedback capacitor coupled between said feedback operational amplifier negative terminal and said feedback operational amplifier output;
   an input resistor coupled to said feedback operational amplifier output;
   an inverting operational amplifier having a negative terminal coupled to said input resistor, a positive terminal coupled to said reference voltage, and an output;
   a second resistor, coupled between said inverting operational amplifier negative terminal and said inverting operational amplifier output;
   a second input resistor coupled to said inverting operational amplifier output;
   a second operational amplifier, having a negative terminal coupled to said second input resistor, a positive terminal coupled to said reference voltage, and an output;
   a second capacitor coupled between said second operational amplifier negative terminal and said second operational amplifier output; and
   a third resistor coupled between said second operational amplifier output and said feedback operational amplifier negative terminal.

16. The circuit of claim 15 wherein said reference voltage is ground.

17. A method for providing gain control and frequency-selective filtering in an integrated filter circuit that filters an input signal $v_{in}$, said filter circuit having a passband gain, said method comprising:
   receiving said input signal at an input node;
   producing a filtered output signal $v_{out}$ at an output node, said output signal including a component of electrical noise produced by said filter circuit; and
   controlling said passband gain of said filter circuit by:
      adjusting the impedance value of a variable impedance circuit coupled to said input node such that said passband gain of said filter circuit is substantially inversely proportional to the impedance value of said variable impedance circuit;
      providing an active circuit having a virtual ground node coupled to said variable impedance circuit, and an output coupled to said output node; and
      providing a feedback network coupled to said virtual ground node and to said active circuit output that includes resistors and operational amplifiers such that electrical noise in $v_{out}$ is dominated by electrical noise from said resistors in said feedback network.

18. The method of claim 17 wherein said step of adjusting said variable impedance circuit further comprises the step of reducing the impedance value of said variable impedance circuit such that said passband gain of said filter circuit increases more precipitously than reducing the impedance value of said variable impedance circuit increases said electrical noise in $v_{out}$.

19. The method of claim 17 wherein said step of adjusting said variable impedance circuit further comprises adjusting a discrete element.

20. The method of claim 17 wherein said step of adjusting said variable impedance circuit further comprises manually adjusting said variable impedance circuit.

21. The method of claim 17 wherein said step of adjusting said variable impedance circuit further comprises electronically adjusting said variable impedance circuit.

22. The method of claim 21 wherein said step of adjusting said variable impedance circuit further comprises adjusting a resistive multiplying digital-to-analog converter.

23. The method of claim 21 wherein said step of adjusting said variable impedance circuit further comprises adjusting an array of switches and resistors.

24. The method of claim 23 wherein said step of adjusting said variable impedance circuit further comprises:
   adjusting at least two electronic switches coupled between said input node and output node; and
   providing at least one weighted resistor coupled to each of said electronic switches.

25. The method of claim 24, wherein said step of providing said weighted resistor comprises providing a first weighted resistor coupled in series to a first electronic switch and a second weighted resistor coupled in series to a second electronic switch, wherein said second weighted resistor has a resistive value fixed at some pre-determined proportion of the resistive value of said first weighted resistor.

26. The method of claim 21 wherein said filter circuit is characterized as a non-lowpass filter and wherein said step of adjusting said variable impedance circuit further comprises adjusting a capacitive multiplying digital-to-analog converter.

27. The method of claim 21 wherein said filter circuit is characterized as a non-lowpass filter and wherein said step of adjusting said variable impedance circuit further comprises adjusting an array of switches and capacitors.

28. The method of claim 27 wherein said step of adjusting said variable impedance circuit further comprises:

adjusting at least two electronic switches coupled between said input node and output node; and providing at least one weighted capacitor with each of said electronic switches.

29. The method of claim 28 wherein said step of providing said weighted capacitor comprises providing a first weighted capacitor coupled in series to a first electronic switch and a second weighted capacitor coupled in series to a second electronic switch, wherein said second weighted capacitor has a capacitive value fixed at some pre-determined proportion of the capacitive value of said first weighted capacitor.

30. The method of claim 17 wherein said step of governing said passband gain comprises providing a non-lowpass filter and wherein providing said variable impedance circuit comprises providing a capacitor-array multiplying digital-to-analog converter.

31. The method of claim 17 wherein said step of providing said feedback network comprises providing:

a feedback operational amplifier, having a negative terminal coupled to said variable impedance circuit, a positive terminal coupled to a reference voltage, and an output;

a feedback resistor coupled between said feedback operational amplifier negative terminal and said feedback operational amplifier output;

a feedback capacitor coupled between said feedback operational amplifier negative terminal and said feedback operational amplifier output;

an input resistor coupled to said feedback operational amplifier output;

an inverting operational amplifier having a negative terminal coupled to said input resistor, a positive terminal coupled to said reference voltage, and an output;

a second resistor, coupled between said inverting operational amplifier negative terminal and said inverting operational amplifier output;

a second input resistor coupled to said inverting operational amplifier output;

a second operational amplifier, having a negative terminal coupled to said second input resistor, a positive terminal coupled to said reference voltage, and an output;

a second capacitor coupled between said second operational amplifier negative terminal and said second operational amplifier output; and a third resistor coupled between said second operational amplifier output and said second operational amplifier negative terminal.

32. The method of claim 31 wherein ground is provided as said reference voltage.

* * * * *

UNITED STATES PATENT AND TRADEMARK OFFICE
CERTIFICATE OF CORRECTION

PATENT NO. : 6,121,908
DATED : September 19, 2000
INVENTOR(S) : Sevastopoulous et al.

Page 1 of 1

It is certified that error appears in the above-identified patent and that said Letters Patent is hereby corrected as shown below:

Title page,
Item [56], OTHER PUBLICATIONS, change "3D" to -- 3d. --;

Column 4,
Line 27, change "Vin" to -- $V_{in}$ --;

Column 6,
Line 46, change "rationing" to -- ratioing --;
Line 58, change "©" to -- (c) --;

Column 8,
Line 44, change "an active" to -- a monolithic active --;
Line 47, change "a feedback" to -- a monolithic feedback --;

Column 10,
Line 9, change "an integrated filter" to -- a substantially monolithically integrated filter --;
Line 16, change "said filter" to -- said monolithic integrated filter --;
Line 17, change "said filter" to -- said monolithic integrated filter --;
Line 20, change "said filter" to -- said monolithic integrated filter --;
Line 23, change "providing an active" to -- providing a monolithic active --;
Line 26, change "a feedback" to -- a monolithic feedback --; and
Line 30, change "network." to -- and electrical noise from said variable impedance element network. --.

Signed and Sealed this

Twenty-eighth Day of May, 2002

Attest:

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO.   : 6,121,908
DATED        : September 19, 2000
INVENTOR(S)  : Nello G. Sevastopoulos and Max Wolff Hauser It is certified that error appears in the above-identified patent and that said Letters Patent is hereby corrected as shown below:

<u>Column 8,</u>
Line 51, change "of said feedback network" to -- and electrical noise from said resistors and electrical noise from said variable impedance element --.

Signed and Sealed this

Third Day of December, 2002

JAMES E. ROGAN
*Director of the United States Patent and Trademark Office*